US006884677B2

(12) United States Patent
Kim

(10) Patent No.: US 6,884,677 B2
(45) Date of Patent: Apr. 26, 2005

(54) RECESSED GATE ELECTRODE MOS TRANSISTORS HAVING A SUBSTANTIALLY UNIFORM CHANNEL LENGTH ACROSS A WIDTH OF THE RECESSED GATE ELECTRODE AND METHODS OF FORMING SAME

(75) Inventor: Ji-young Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/449,640

(22) Filed: Jun. 2, 2003

(65) Prior Publication Data

US 2004/0072412 A1 Apr. 15, 2004

(30) Foreign Application Priority Data

Oct. 10, 2002 (KR) ................................ 10-2002-0061925

(51) Int. Cl.$^7$ .......................................... H01L 21/8242
(52) U.S. Cl. ........................ 438/243; 438/244; 438/245; 438/270; 438/386; 438/387; 438/689; 438/700; 438/701; 438/713
(58) Field of Search ................................. 438/243–245, 438/386–391, 270–271, 689–701, 254, 713; 257/68–71, 260, 301

(56) References Cited

U.S. PATENT DOCUMENTS

| | | | | |
|---|---|---|---|---|
| 5,030,882 | A | * | 7/1991 | Solero .......................... 313/478 |
| 5,208,657 | A | * | 5/1993 | Chatterjee et al. ........... 257/302 |
| 5,736,435 | A | * | 4/1998 | Venkatesan et al. ......... 438/151 |
| 6,033,991 | A | * | 3/2000 | Ramkumar et al. .......... 438/713 |
| 6,150,693 | A | * | 11/2000 | Wollesen ..................... 257/330 |
| 6,153,478 | A | * | 11/2000 | Lin et al. ...................... 438/296 |
| 6,168,986 | B1 | * | 1/2001 | Walker et al. ............... 438/243 |
| 6,184,071 | B1 | * | 2/2001 | Lee .............................. 438/197 |
| 6,448,139 | B2 | * | 9/2002 | Ito et al. ....................... 438/270 |
| 6,664,167 | B2 | * | 12/2003 | Temmler et al. ............. 438/386 |
| 6,710,403 | B2 | * | 3/2004 | Sapp ............................ 257/330 |
| 2001/0045597 | A1 | * | 11/2001 | Nishinohara ................. 257/329 |
| 2002/0190312 | A1 | * | 12/2002 | Lee .............................. 257/321 |
| 2002/0197823 | A1 | * | 12/2002 | Yoo et al. ..................... 438/424 |
| 2003/0006428 | A1 | * | 1/2003 | Palm et al. ................... 257/200 |
| 2003/0011032 | A1 | * | 1/2003 | Umebayashi ................ 257/368 |
| 2003/0127685 | A1 | * | 7/2003 | Shiozawa et al. ............ 257/326 |
| 2004/0014291 | A1 | * | 1/2004 | Mehrad et al. .............. 438/296 |
| 2004/0067618 | A1 | * | 4/2004 | Chang et al. ................ 438/264 |
| 2004/0195608 | A1 | * | 10/2004 | Kim et al. .................... 257/296 |

FOREIGN PATENT DOCUMENTS

| KR | 1304779 | 12/1989 |
|---|---|---|
| KR | 10-018823 | 9/1995 |

OTHER PUBLICATIONS

Aritome et al. "A side–wall transfer–transistor cell (swatt cell) for highly reliable multi–level nand eeprom's" IEEE Transactions on electron devices vol. 44 No. 1 Jan. 1997 p. 145.*

Lee et al. "An optimized densification of the filled oxide for quarter micron shallow trench isolation (STI)" Symposium on vlsi technology digest of technical papers No. 16.4 p. 158.*

Notice to Submit Response re: Korean Application No.: 2002–61925; Date of Notice to Submit Response Jul. 20, 2004.

* cited by examiner

*Primary Examiner*—Caridad Everhart
*Assistant Examiner*—Granvill D. Lee, Jr.
(74) *Attorney, Agent, or Firm*—Myers Bigel Sibley & Sajovec, PA

(57) ABSTRACT

A transistor can include an integrated circuit substrate including spaced apart isolation regions therein and an active region therebetween. A recess is formed in the active region and extends between the spaced apart isolation regions and has a bottom and opposing side wall ends that are defined by facing portions of the spaced apart isolation regions. An electrically insulating layer is formed on the bottom of the recess. A conductive material is formed in the recess on the electrically insulating layer to provide a gate electrode.

22 Claims, 8 Drawing Sheets

US 6,884,677 B2

RECESSED GATE ELECTRODE MOS TRANSISTORS HAVING A SUBSTANTIALLY UNIFORM CHANNEL LENGTH ACROSS A WIDTH OF THE RECESSED GATE ELECTRODE AND METHODS OF FORMING SAME

RELATED APPLICATION

This application claims the benefit of Korean Patent Application No. 2002-61925 filed Oct. 10, 2002, in the Korean Intellectual Property Office, the disclosure of which is hereby incorporated herein by reference in its entirety as if set forth fully herein.

FIELD OF THE INVENTION

This invention relates to Metal-Oxide-Semiconductor (MOS) transistors and methods of forming the same, and more particularly, to MOS transistors including recessed gate electrodes and methods of forming the same.

BACKGROUND

The performance of small transistors, such as MOSFETs, can be affected by a short-channel effect commonly referred to as "punchthrough." Punchthrough can be observed when a depletion region generated, for example, by the drain region of a MOSFET, contacts or comes into close proximity with an opposing depletion region generated by the opposing source region of the MOSFET. The contact of the depletion regions can cause charge to transfer between the source and drain region regardless of the voltage supplied to the gate. Therefore, MOSFETs affected by punchthrough may lose the ability to function as a switch (i.e., to turn off completely).

To reduce or prevent short-channel effects, it is known to form a recessed gate electrode having a small critical dimension and a long channel. Recessed gate electrodes are described herein with reference to FIGS. 1 through 3. FIG. 1 is a plan view of a typical MOS transistor. FIG. 2 is a cross-sectional view of the MOS transistor of FIG. 1, taken along the line I–I'. FIG. 3 is a cross-sectional view of the MOS transistor of FIG. 1, taken along the line II–II'.

As shown in FIGS. 1 through 3, isolation regions 12 are formed on an integrated circuit substrate 10 to define an active region A in the integrated circuit substrate 10, using techniques know to those having skill in the art. Next, a portion of the active region A, in which a gate electrode is subsequently formed, is etched to form a gate trench (or a recess) 15 to predetermined width and depth. The width of the gate trench 15 is less than or about equal to a width of the gate electrode, and the depth of the gate trench 15 is can be based on the channel length of the MOS transistor. Next, a surface of the integrated circuit substrate 10 including the gate trench 15 is oxidized to form a gate oxide layer 18. Thereafter, the gate trench 15 is filled with a conductive material and then patterned, thereby forming a gate electrode 20. The gate electrode 20 has a critical dimension W and a channel length CL which corresponds to a length of the outline of the gate trench 15 in the cross-sectional view shown in FIG. 2.

However, the MOS transistor of FIG. 1 may have some disadvantages. As shown in FIGS. 2 and 3, the gate trench 15, in which the gate electrode 20 is formed, can have a tapered side wall. The tapered side wall can be caused when the etch gas does not penetrating deeply enough into the integrated circuit substrate 10, i.e., the amount of etching provided by the gas may decrease as the depth of the recess is increased. The tapered side wall of the gate trench 15 can cause the channel length of the transistor to be non-uniform. For example, as shown in FIG. 3, the channel length corresponding to cross-section a of the transistor (hereinafter referred to as the "flat transistor" region), which is near or at the center of the active region A, can be different from the channel length corresponding to cross-section b (hereinafter referred to as the "corner transistor" region) which is located at an edge of the active region A.

FIG. 4 is a cross-sectional view comparing the respective channel lengths of the flat transistor region a and the corner transistor region b. A gate trench 15 is formed to a desired depth in a region of the trench 15 corresponding to the flat transistor region a of FIG. 3, thereby obtaining a channel length CL1. In contrast, the channel formed in a corner region of the trench 15 corresponding to the corner transistor region b of FIG. 3, is shallow compared to the channel of the flat transistor region a. Therefore, the length of the channel CL2 is less than the channel length CL1.

Since the corner transistor region b of FIG. 3 has a shorter channel length than the flat transistor region a of FIG. 3, a threshold voltage $V_{thb}$ in the corner transistor region b can be less than a threshold voltage $V_{tha}$ of the flat transistor region a. As a result, two different threshold voltages $V_{thb}$ and $V_{tha}$ can be observed in the active region as shown in FIG. 5. This phenomenon can cause a current $I_{off}$ to be generated unless a gate voltage is applied to the transistor.

SUMMARY

Some embodiments according to the invention can provide recessed gate electrode MOS transistors having a substantially uniform channel length across a width of the recessed gate electrode. Pursuant to these embodiments, a transistor can include an integrated circuit substrate including spaced apart isolation regions therein and an active region therebetween. A recess is formed in the active region and extends between the spaced apart isolation regions and has a bottom and opposing side wall ends that are defined by facing portions of the spaced apart isolation regions. An electrically insulating layer is formed on the bottom of the recess. A conductive material is formed in the recess on the electrically insulating layer to provide a gate electrode.

In some embodiments according to the invention, the gate electrode directly contacts at least one of the opposing side wall ends of the recess. In some embodiments according to the invention, the opposing side wall ends of the recess are free of the electrically insulating layer. In some embodiments according to the invention, the bottom and one of the opposing side walls of the recess define an acute angle.

In some embodiments according to the invention, a longitudinal side wall of the recess extends between the opposing side wall ends and is substantially orthogonal to the bottom of the recess. In some embodiments according to the invention, the bottom of the recess is above a bottom of at least one of the spaced apart isolation regions.

In some embodiments according to the invention, a MOS transistor includes a gate electrode embedded in an active region of a substrate configured to control conduction of carriers through a channel in the active region opposite the gate electrode, wherein a length of the channel between a source region and a drain region is substantially uniform across an entire width of the channel.

In some embodiments according to the invention, the channel is only beneath a bottom of the gate electrode. In some embodiments according to the invention, an isolation region defines one end of the width of the channel at the bottom of the gate electrode.

In other embodiments according to the invention, methods of forming a gate electrode of a transistor include forming a recess in an active region between spaced apart isolation regions of a substrate, the recess extending between the spaced apart isolation regions and having a bottom and opposing side wall ends defined by facing portions of the spaced apart isolation regions. An electrically insulating layer can be formed on the bottom of the recess. A gate electrode can be formed in the recess on the electrically insulating layer.

In other embodiments according to the invention, methods of forming a gate electrode of a transistor include removing a first portion of the substrate between the spaced apart isolation regions to form a first portion of the recess wherein the opposing faces of the isolation regions are covered by remaining portions of the substrate. A surface of the remaining portions is oxidized to form an oxidize surface of the remaining portions. The oxidized surface can be removed to expose the opposing faces of the isolation regions.

In some embodiments according to the invention, an active region between spaced apart isolation regions of a substrate is etched to form a recess extending between the spaced apart isolation regions having a bottom and opposing side wall ends defined by remaining portions the substrate on opposing facing portions of the spaced apart isolation regions. The remaining portions can be isotropically etched to expose the opposing facing portions of the spaced apart isolation regions to enlarge the recess so that the opposing side wall ends of the recess are defined by opposing facing portions of the spaced apart isolation regions. An electrically insulating material can be formed on the bottom extending between the opposing facing portions of the spaced apart isolation regions. A conductive material can be formed in the recess on the electrically insulating layer to form a gate electrode in the recess.

DESCRIPTION OF EMBODIMENTS ACCORDING TO THE INVENTION

Figure 1:
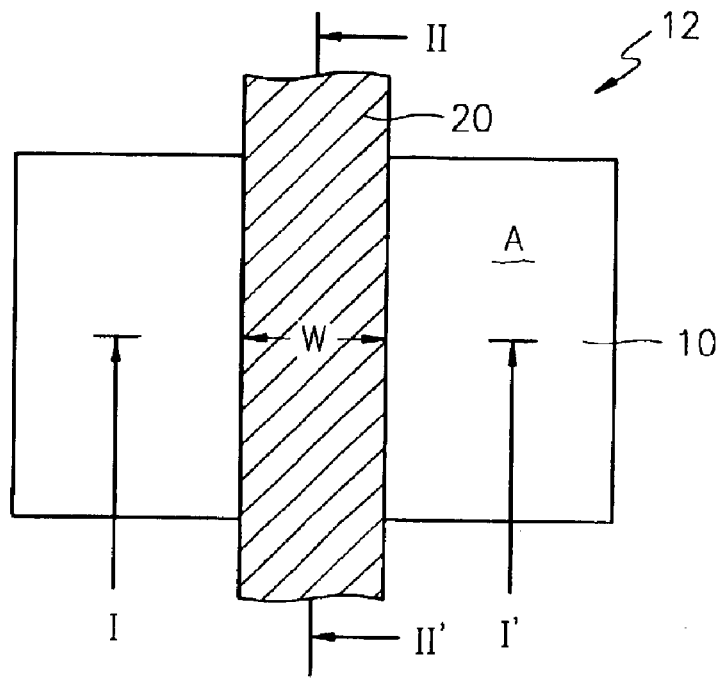
FIG. 1 is a plan view of a conventional MOS transistor.
Figure 2:
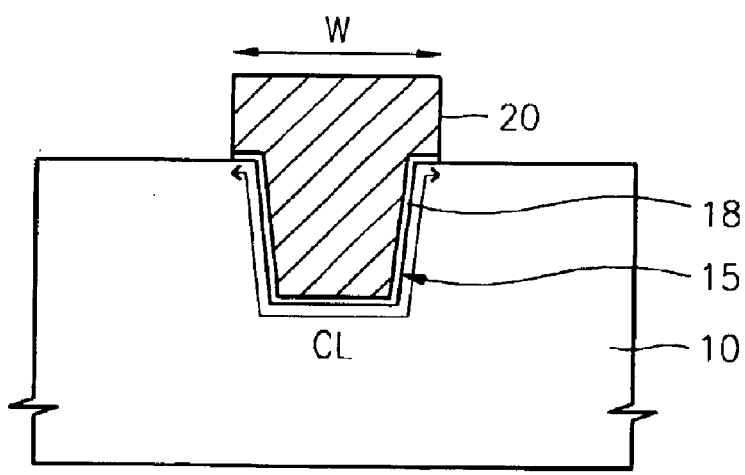
FIG. 2 is a cross-sectional view of the MOS transistor of FIG. 1, taken along the line I–I'.
Figure 3:
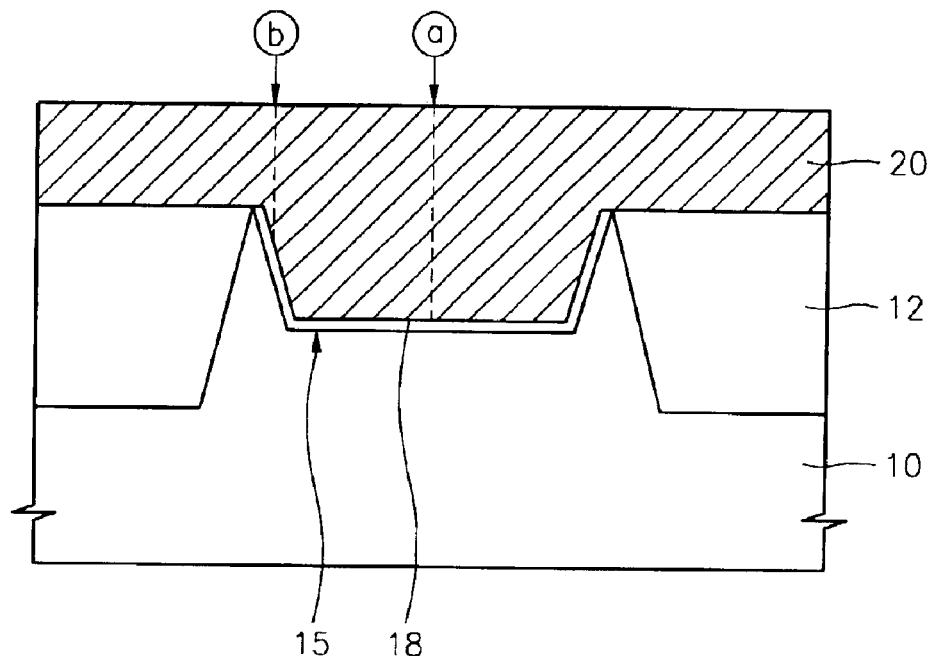
FIG. 3 is a cross-sectional view of the MOS transistor of FIG. 1, taken along the line II–II'.
Figure 4:
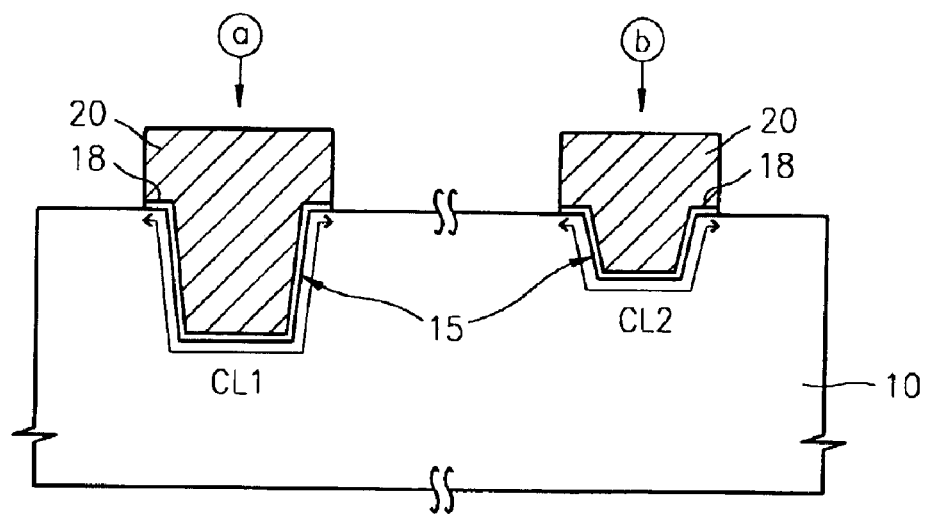
FIG. 4 is a cross-sectional view comparing a flat transistor region with a corner transistor region of FIG. 1.
Figure 5:
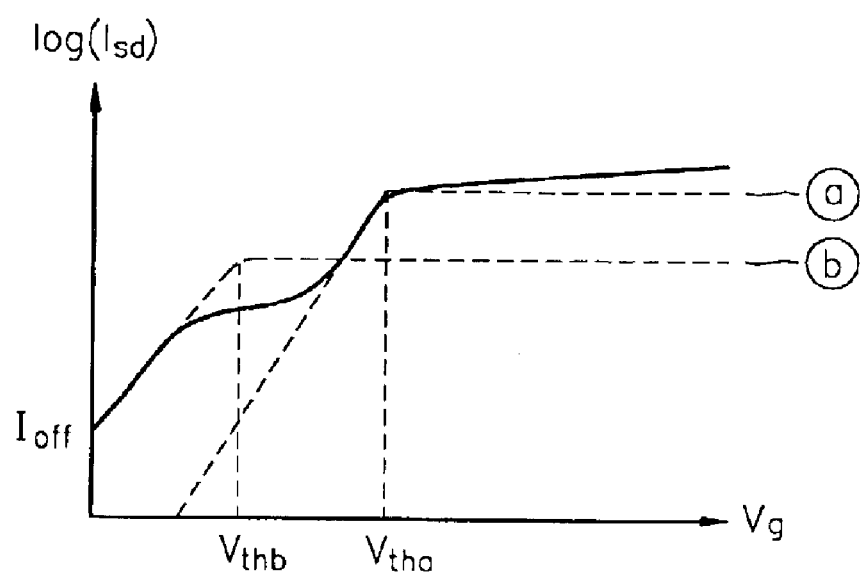
FIG. 5 is a graph illustrating threshold voltages associated with a conventional transistor.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

FIGS. 6A through 6D are cross-sectional views illustrating embodiments of Metal-Oxide-Semiconductor (MOS) transistors according to embodiments of the invention. It will be understood that x denotes the cross-section of a MOS transistor, taken along the line I–I' of FIG. 9, and y denotes the cross-section area of the MOS transistor, taken along the line II–II' of FIG. 9.

Figure 6A:
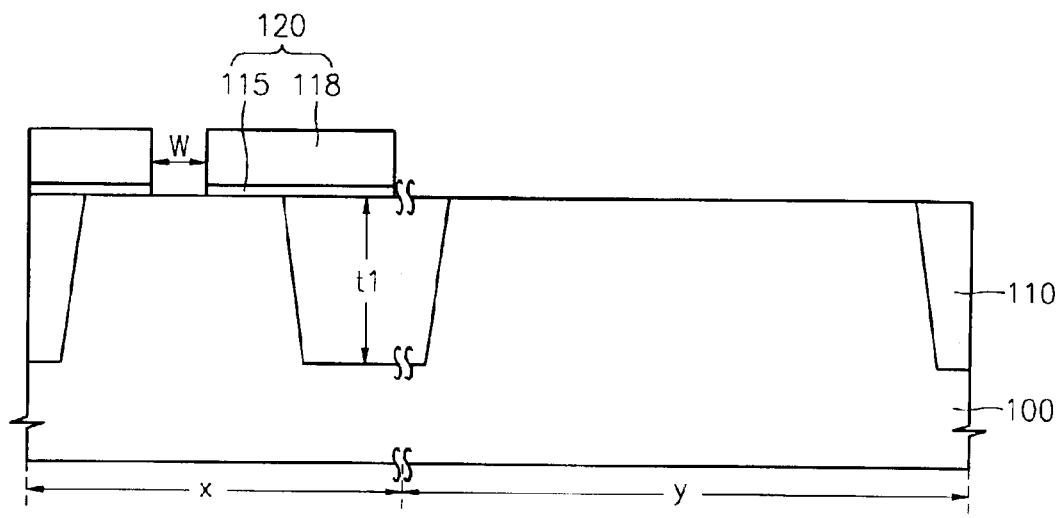
FIG. 6A through 6D are cross-sectional views illustrating embodiments of MOS transistors according to the invention and methods of forming same.

Referring to FIG. 6A, isolation layers (or regions) 110 are formed in predetermined portions of an integrated circuit substrate 100, which is formed of silicon, so as to define an active region (refer to the active region A shown in FIG. 1) between the isolation layers 110 in the integrated circuit substrate 100. The isolation layers 110 are formed to a depth t1 using, for example, shallow trench isolation (STI). For instance, the isolation layers 110 may be formed to a depth of about 200–300 nm. A mask pattern 120 is formed on the integrated circuit substrate 100 to define a gate electrode in the integrated circuit substrate 100. In particular, the mask pattern 120 is formed to expose portions in which a gate electrode is to be formed, and composed of layers that have different etching selectivity with respect to the integrated circuit substrate 100, which can be silicon. In some embodiments according to the invention, the mask pattern 120 is a stacked structure of a pad oxide layer 115 and a silicon nitride layer 118. In some embodiments according to the invention, the distance W between adjacent mask patterns 120 is less than or about equal to a critical dimension of a gate electrode, which is subsequently formed. In some embodiments according to the invention, W is about 100 nm or less.

Figure 6B:
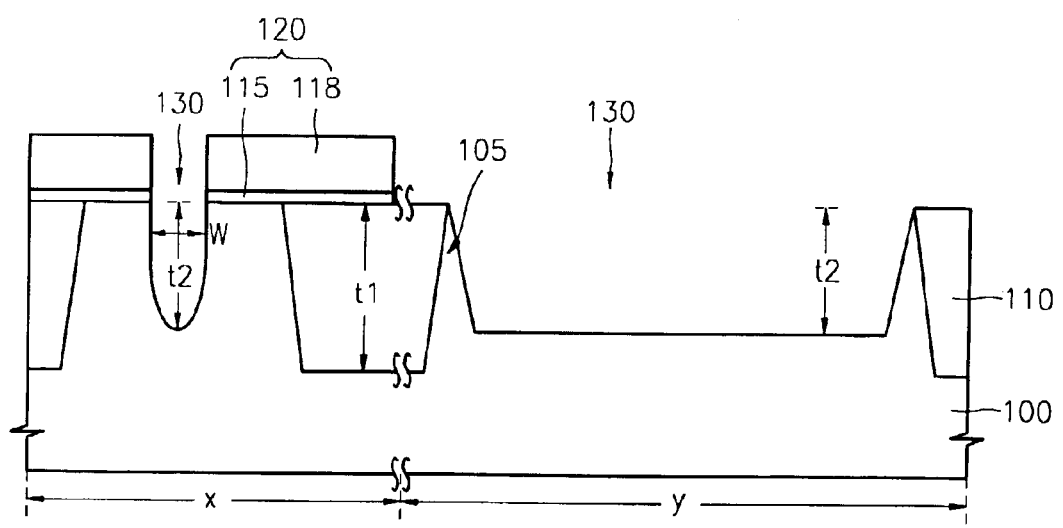

As shown in FIG. 6B, the integrated circuit substrate 100 between the mask patterns 120 is etched to a predetermined depth t2 to form a gate recess, (here a trench 130) using the mask pattern 120. The critical dimension W of the gate trench 130 is less than or about equal to a critical dimension of the gate electrode. In some embodiments according to the invention, the depth of the gate trench 130 is determined based on a desired channel length. In some embodiments according to the invention, the depth of the gate trench 130 is less than a completed depth, which can be subsequently provided by a subsequent etching process. For example, the gate trench 130 may be formed to a depth t2 in a range between about 100 nm and about 150 nm.

As discussed above, when etching the integrated circuit substrate 100, the deeper the etching, the less the etching gas may penetrate into the integrated circuit substrate 100. As a result, a side wall of the gate trench 130 may have a tapered profile so a bottom of the trench is narrower than the opening of the trench 130. In some embodiments according to the invention, the side walls of the gate trench 130 must contact those of the isolation layer 110 in a normal case. A remaining portion 105 of the integrated circuit substrate 100, which is formed of silicon, covers opposing faces of the isolation layers 110 as illustrated in the region y of FIG. 6B, i.e., when the gate trench 130 is viewed from the longitudinal direction.

Figure 6C:
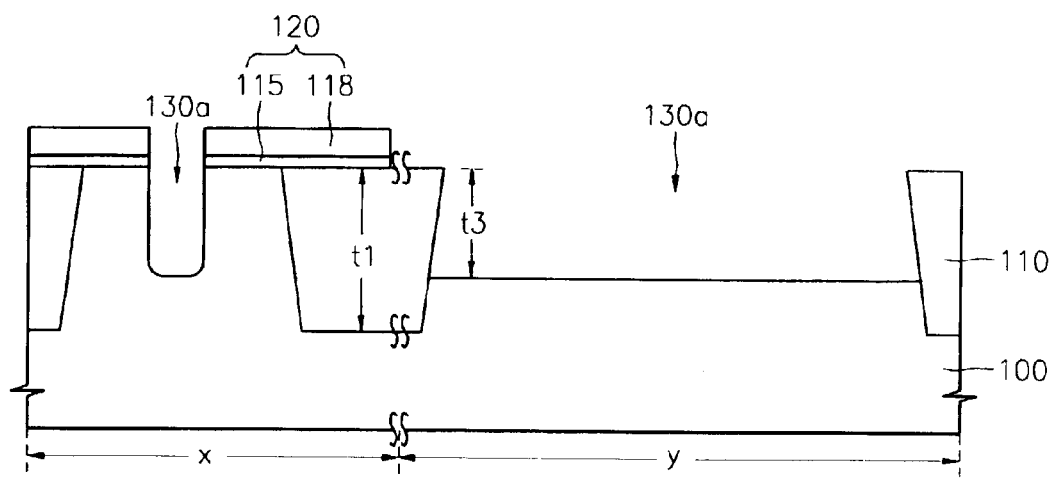

Referring to FIG. 6C, the gate trench 130 is isotropically etched to remove the remaining portion 105 that covers the opposing faces of the isolation layers 110 in the gate trench 130 thereby enlarging the length of the gate trench to form gate trench 130a. The isotropic etching maybe performed on the gate trench 130 by chemical dry etching, using gas, for example, $CF_4+O_2$, which etches silicon selectively and isotropically. As a result of the isotropic etching, the remaining portion 105 between the isolation layer 110 and the gate trench 130 is removed to expose the opposing faces of the isolation layers 110.

The exposed opposing faces of the isolation layers 110 define opposing side walls of the gate trench 130a. In some embodiments according to the invention, the exposed opposing faces of the isolation layers 110 directly contact a conductive material that is subsequently formed in the gate trench 130a. The opposing side wall ends of the gate trench 130a and the bottom of the gate trench 130a define an cute angle. The side walls of the gate trench 130a (or longitudinal side walls) define a substantially orthogonal angle with the exposed opposing faces of the isolation layers 110 in the region x, when the gate trench 130a is viewed from the short axial direction, i.e., widthwise.

During the isotropic etching, the bottom of the gate trench 130a may be etched to a thickness between 10 nm and 50 nm. A portion of the substrate 100 beneath the gate trench 130 remains (i.e., is not removed by the isotropic etching) so that an electrically insulating layer can be formed on the bottom of the gate trench 130 between the opposing faces of the isolation layers 110.

The active region covered by the mask pattern 120 is protected from the etching gas. However, the mask pattern 120 may be partially removed by the etching gas so that the thickness of the mask pattern 120 is reduced. Accordingly, the depth of the gate trench 130a is between 110 nm and 200 nm.

Figure 6D:
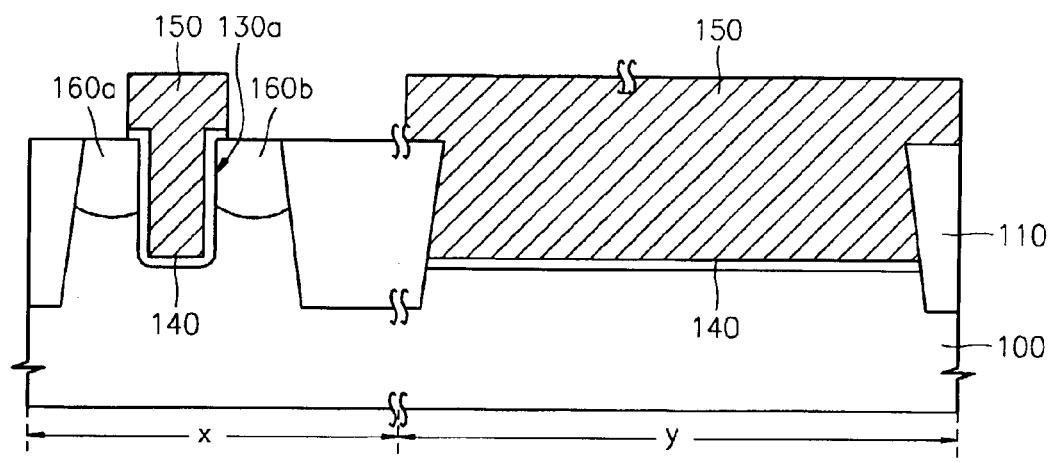

As shown in FIG. 6D, the mask pattern 120 is removed using techniques known to those having skill in the art. A cleaning process is performed on the resultant structure of the integrated circuit substrate 100, thereby removing damaged portions due to the formation of the gate trench 130a.

Still referring to FIG. 6D, a gate oxide layer (or electrically insulating layer) 140 is formed on the resultant structure of the integrated circuit substrate 100 using techniques known to those having skill in the art. As shown in FIG. 6D, the opposing side wall ends of the gate trench are free of the gate oxide layer 140. A material conductive material is deposited on the gate oxide layer 140. For example, the conductive material can be doped polysilicon. The conductive material can completely fill the gate trench 130a. The conductive material and/or the gate oxide layer 140 are patterned to form an embeded gate electrode 150 in the gate trench 130a. Impurities ions, which are different types from the material for the integrated circuit substrate 100, are implanted into the integrated circuit substrate 100 between adjacent gate electrodes 150 to form junction regions 160a and 160b, thereby forming a MOS transistor. The junction regions 160a and 160b may be formed to a depth of 100 nm or less.

The threshold voltage of the MOS transistor can be adjusted to a desired level by implanting ions into a lower portion of the gate electrode 150. In some embodiments according to the invention, the ion implantation is performed after the formation of the isolation layer 110 or between the additional etching of the gate trench 130 and the formation of the gate oxide layer 140.

In some embodiments according to the invention, as illustrated for example by FIG. 6D, the channel is located in the substrate between the source and drain regions only beneath the bottom of the gate trench (or recess). In some embodiments according to the invention, no portion of the channel is located on the side wall ends of the recess. Accordingly, the channel width can be substantially uniform across the entire width of the gate electrode, thereby reducing the double hump phenomenon discussed above.

Figure 7A:
FIGS. 7A and 7B are Scanning Electron Microscope (SEM) photographs of an integrated circuit substrate after gate trenches are isotropically etched according to the invention.
Figure 7B:
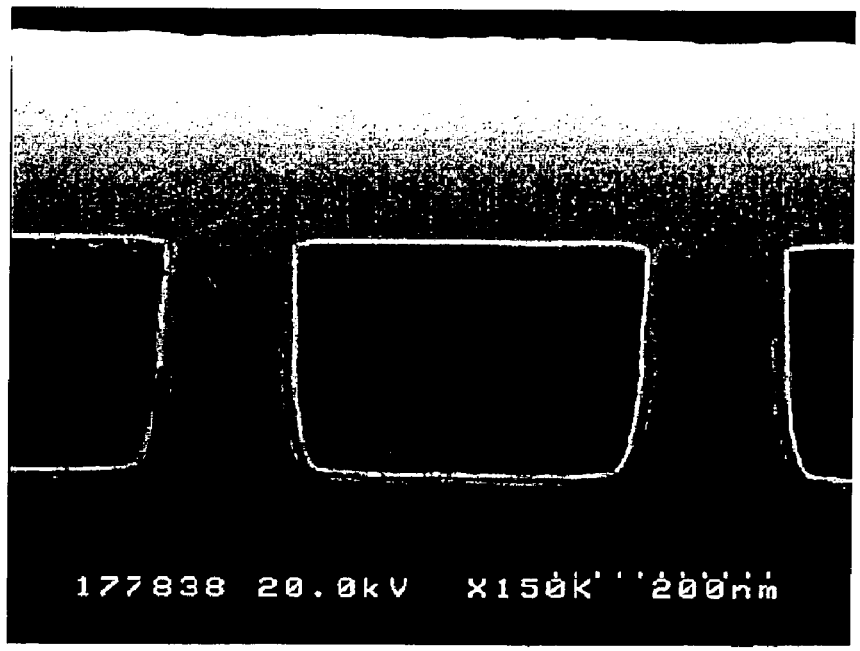

FIGS. 7A and 7B are SEM photographs illustrating the integrated circuit substrate 100 in which the gate trench 130 is additionally, isotropically etched according to the invention. FIG. 7A illustrates the gate trench 130a in the region x of FIG. 6C, viewed in the short axial (or width) direction of the gate trench. In FIG. 7A, the side walls of the gate trench 130a form substantially orthogonal angles with an upper surface of the integrated circuit substrate 100. FIG. 7B illustrates the gate trench 130a in the region y of FIG. 6C, viewed in the long axial direction, i.e.,. lengthwise. As shown, the integrated circuit substrate 100 is hardly present between the isolation layer 110 and the gate trench 130a.

According to embodiments of the invention, the integrated circuit 100 is etched and then chemically, isotropically etched in order to form the gate trench 130a. As a result, the side walls of the gate trench 130a are defined by the opposing faces of the spaced apart isolation layers 130. Furthermore, the side walls define about orthogonal angles with an upper surface of the integrated circuit substrate 100 and with the opposing faces of the isolation layers 110. When the gate trench 130a is viewed in the long axial direction, the gate trench 130a directly contacts the isolation layers 110. Accordingly, the channel length in a comer region of the gate electrode of the transistor can be about equal to the channel length in a flat region of the gate electrode of the transistor.

Figure 8A:
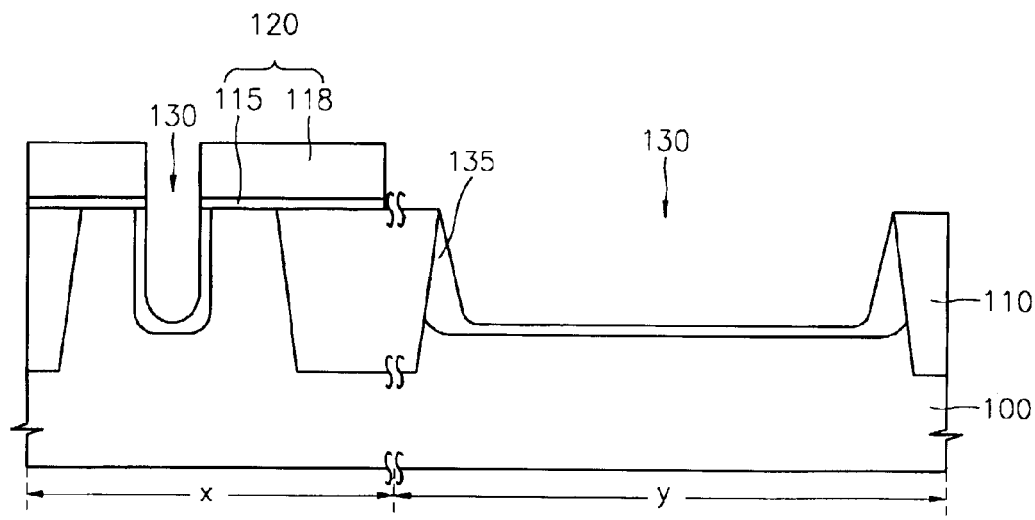
FIGS. 8A and 8B are cross-sectional views illustrating embodiments of MOS transistors according to the invention.
Figure 8B:
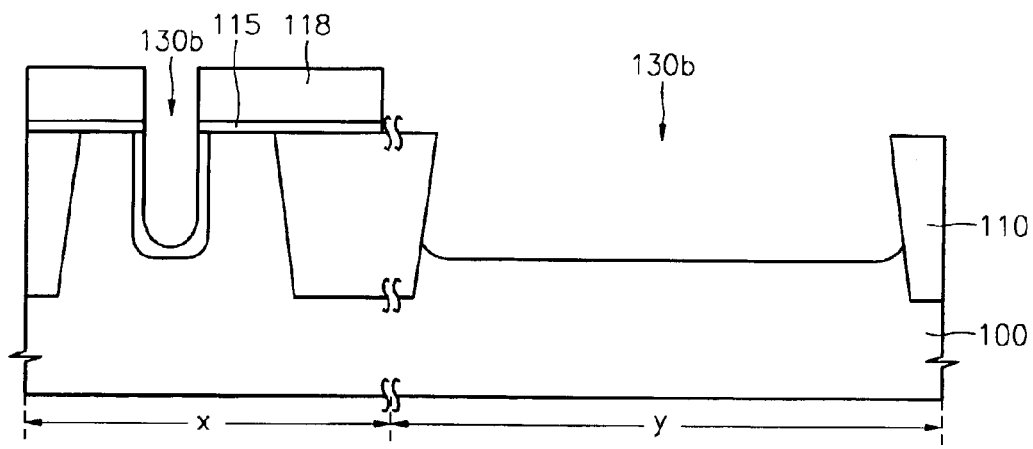
Figure 9:
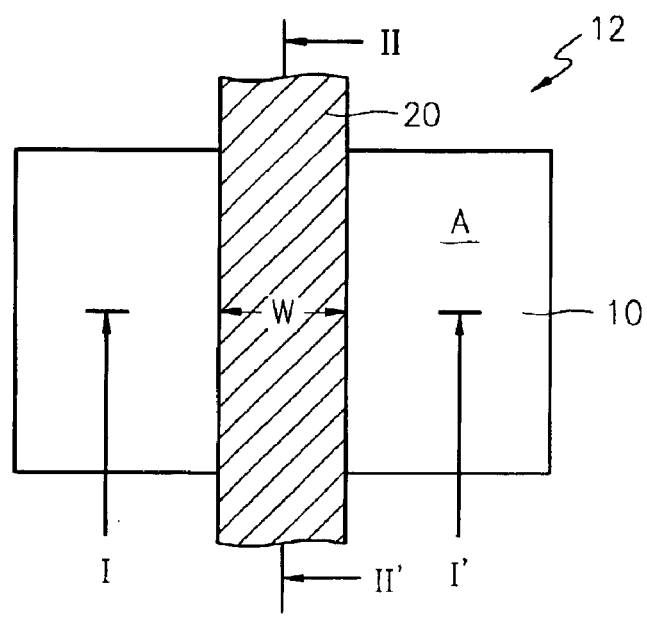
FIG. 9 is a plan view of a MOS transistor according to the invention.

FIGS. 8A and 8B are cross-sectional views illustrating further embodiments of MOS transistors according to the invention and methods of forming the same. x denotes the cross-section of the MOS transistor, taken along the line I–I' of FIG. 9, and y denotes the cross-section area of the MOS transistor, taken along the line II–II' of FIG. 9. It will be understood that embodiments of MOS transistors illustrated in FIG. 9 can be formed using the methods described above in reference to FIGS. 6A and 6B. Accordingly, no further detailed description of those steps are provided.

As shown in FIG. 8A, exposed portions of gate trench 130 are thermally oxidized to a predetermined thickness. As a result, a thermal oxide layer 135 is formed along the inner surface of the gate trench 130. in order to remove an integrated circuit substrate 100 between the gate trench 130 and an isolation layer 110, viewed in the long axial direction of a gate trench and improve the profile of the sidewalls of the gate trench 130. It is preferable that the thickness of the thermal oxide layer 135 is determined so that the distance between the gate trench 130 and the isolation layer 110 can be minimized. In some embodiments according to the invention, the extent of the thermal oxidation is controlled to form a gate oxide layer on the substrate 100 between opposing faces of the isolation layers 110 during a subsequent step. As shown in FIG. 8B, the thermal oxide layer 135 is removed using a conventional technique, thereby forming a gate trench 130b, the profile of the sidewalls of which may be improved. Although not shown in the drawings, a gate oxide layer 140, a gate electrode 150, and a junction region 160 can be sequentially formed as disclosed, for example, in FIG. 6D, to form a MOS transistor.

As described above, according to the invention, an integrated circuit substrate is etched to form a gate trench, and is then etched again to remove the integrated circuit substrate present between the gate trench and an isolation layer when the gate trench is viewed in the long axial direction. In this way, the distance between the gate trench and the isolation layer can be minimized. Therefore, a channel length controlled by a corner region of a gate electrode can be about equal to a channel length controlled by a flat region of the gate electrode, thereby reducing a double hump phenomenon that may otherwise cause excessive leakage current in small scale MOS transistor.

What is claimed:

1. A transistor comprising:
    an integrated circuit substrate including spaced apart isolation regions therein and an active region therebetween;
    a recess in the active region extending between the spaced apart isolation regions and having a bottom and opposing side wall ends defined by facing portions of the spaced apart isolation regions;
    an electrically insulating layer on the bottom of the recess; and
    a conductive material in the recess on the electrically insulating layer to provide a gate electrode.

2. A transistor according to claim 1 further comprising:
    first and second source/drain regions in the active region on opposite sides of the gate electrode; and
    a channel in the active region opposite the gate electrode between the first and second source/drain regions that extends along the recess.

3. A transistor according to claim 1 wherein the gate electrode directly contacts at least one of the opposing side wall ends of the recess.

4. A transistor according to claim 1 wherein the opposing side wall ends of the recess are free of the electrically insulating layer.

5. A transistor according to claim 1 wherein the bottom and one of the opposing side walls of the recess define an acute angle.

6. A transistor according to claim 1, wherein:
    a longitudinal side wall of the recess extends between the opposing side wall ends, substantially orthogonal to the bottom of the recess.

7. A transistor according to claim 1 wherein the bottom of the recess is above a bottom of at least one of the spaced apart isolation regions.

8. A transistor comprising a gate electrode embedded the recess having in an active region of a substrate, the recess having opposing side wall ends defined by facing portions of spaced apart isolation regions in the substrate, the gate electrode configured to control conduction of carriers through a channel in the active region opposite the gate electrode, wherein a length of the channel between a source region and a drain region is substantially uniform across an entire width of the channel.

9. A transistor according to claim 8 wherein the channel is only beneath a bottom of the gate electrode.

10. A transistor according to claim 8 further comprising:
    an isolation region that defines one end of the width of the channel at the bottom of the gate electrode.

11. A method of forming a gate electrode of a transistor comprising:
    forming a recess in an active region between spaced apart isolation regions of a substrate, the recess extending between the spaced apart isolation regions and having a bottom and opposing side wall ends defined by facing portions of the spaced apart isolation regions;
    forming an electrically insulating layer on the bottom of the recess; and
    forming a gate electrode in the recess on the electrically insulating layer.

12. A method according to claim 11 wherein the step of forming a recess comprises:
    removing a first portion of the substrate between the spaced apart isolation regions to form a first portion of the recess wherein the opposing faces of the isolation regions are covered by remaining portions of the substrate; and
    separately removing the remaining portions of the substrate to expose the opposing faces of the isolation regions.

13. A method according to claim 12:
    wherein the step of removing a first portion comprises etching the substrate to form the first portion of the recess; and
    wherein the step of separately removing comprises isotropically etching the remaining portions to expose the opposing faces of the isolation regions.

14. A method according to claim 12 wherein the step of removing a first portion comprises etching the substrate to a level above a bottom of the isolation regions.

15. A method according to claim 14 wherein the level comprises about 100 nm to about 150 nm below a surface of the isolation regions.

16. A method according to claim 12 wherein the step of separately removing comprises isotropically etching the remaining portions further comprises etching a bottom surface of the recess to reduce a level of the bottom in a range between about 10 nm to about 50 nm.

17. A method according to claim 11 wherein the step of forming a recess comprises:
    removing a first portion of the substrate between the spaced apart isolation regions to form a first portion of the recess wherein the opposing faces of the isolation regions are covered by remaining portions of the substrate;
    oxidizing a surface of the remaining portions to form an oxidize surface of the remaining portions; and removing the oxidized surface to expose the opposing faces of the isolation regions.

18. A method of forming a gate electrode of a transistor comprising:

etching an active region between spaced apart isolation regions of a substrate to form a recess extending between the spaced apart isolation regions and having a bottom and opposing side wall ends defined by remaining portions the substrate on opposing facing portions of the spaced apart isolation regions;

isotropically etching the remaining portions to expose the opposing facing portions of the spaced apart isolation regions to enlarge the recess so that the opposing side wall ends of the recess are defined by opposing facing portions of the spaced apart isolation regions;

forming an electrically insulating material on the bottom extending between the opposing facing portions of the spaced apart isolation regions; and forming a conductive material in the recess on the electrically insulating layer to form a gate electrode in the recess.

19. A method according to claim 18 wherein the step of isotropically etching comprises removing all of the remaining portions from opposing facing portions of the spaced apart isolation regions so that the isolation regions are exposed.

20. A method according to claim 18 wherein the gate electrode controls conduction through a channel in the substrate that is only beneath the gate electrode.

21. A method according to claim 18 wherein the step of isotropically etching comprises isotropically etching using $CF_4+O_2$ gas.

22. A method according to claim 18 wherein the step of etching an active region between spaced apart isolation regions of a substrate to form a recess comprises:

etching the active region between spaced apart isolation regions of a substrate to form a recess of a width that is less than or equal to a critical dimension of the gate electrode.

* * * * *

UNITED STATES PATENT AND TRADEMARK OFFICE
CERTIFICATE OF CORRECTION

PATENT NO. : 6,884,677 B2
DATED : April 26, 2005
INVENTOR(S) : Kim

Page 1 of 1

It is certified that error appears in the above-identified patent and that said Letters Patent is hereby corrected as shown below:

<u>Column 8,</u>
Lines 8-9, should read -- A transistor comprising a gate electrode embedded in a recess in an active region of a substrate, the recess --.

Signed and Sealed this

Thirtieth Day of August, 2005

JON W. DUDAS
*Director of the United States Patent and Trademark Office*